(12) United States Patent
Fross et al.

(10) Patent No.: US 6,384,627 B1
(45) Date of Patent: May 7, 2002

(54) LOGIC BLOCK USED AS DYNAMICALLY CONFIGURABLE LOGIC FUNCTION

(75) Inventors: Bradley K. Fross, Claremont; Edward S. McGettigan, San Jose, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/788,062

(22) Filed: Feb. 16, 2001

(51) Int. Cl.⁷ .................................................. H03K 7/38
(52) U.S. Cl. .............................. 326/39; 326/38; 326/40; 326/41
(58) Field of Search ..................... 326/37–41

(56) References Cited

U.S. PATENT DOCUMENTS

| | | |
|---|---|---|
| 5,343,406 A | 8/1994 | Freeman et al. |
| 5,818,255 A * | 10/1998 | New et al. .............. 326/39 |
| 5,889,413 A | 3/1999 | Bauer et al. |
| 5,914,616 A | 6/1999 | Young et al. |
| 6,118,298 A | 9/2000 | Bauer et al. |
| 6,262,597 B1 * | 7/2001 | Bauer et al. .............. 326/41 |

OTHER PUBLICATIONS

U.S. Application No. 08/786,818, Chapman et al., filed Jan. 21, 1997.
U.S. Application No. 09/574,534, Bauer et al., filed May 19, 2000.

\* cited by examiner

*Primary Examiner*—Michael Tokar
*Assistant Examiner*—Vibol Tan
(74) *Attorney, Agent, or Firm*—Edel M. Young

(57) ABSTRACT

A method of configuring an FPGA lookup table to implement both exact and relative matching comparators is disclosed. Examples of exact matching of two variables, exact matching of a variable to a constant, relative matching (greater than) of a variable to a constant, and combined exact and relative matching are discussed. Use of the comparator to trigger a logic analyzer to collect data is discussed.

21 Claims, 9 Drawing Sheets

Combined exact and relative matching comparator unit used to compare one set of inputs at a time.

Cascaded combined exact and relative matching comparator units.

4-Input Lookup Table / 16-Bit Shift Reigster

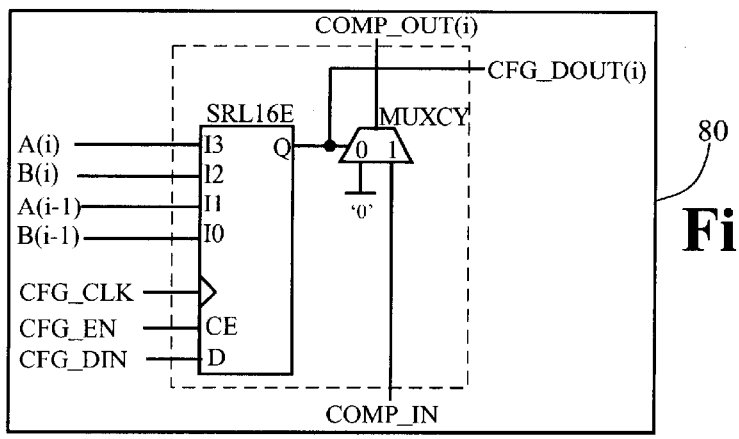
Exact matching comparator unit used to compare two sets of inputs at a time.
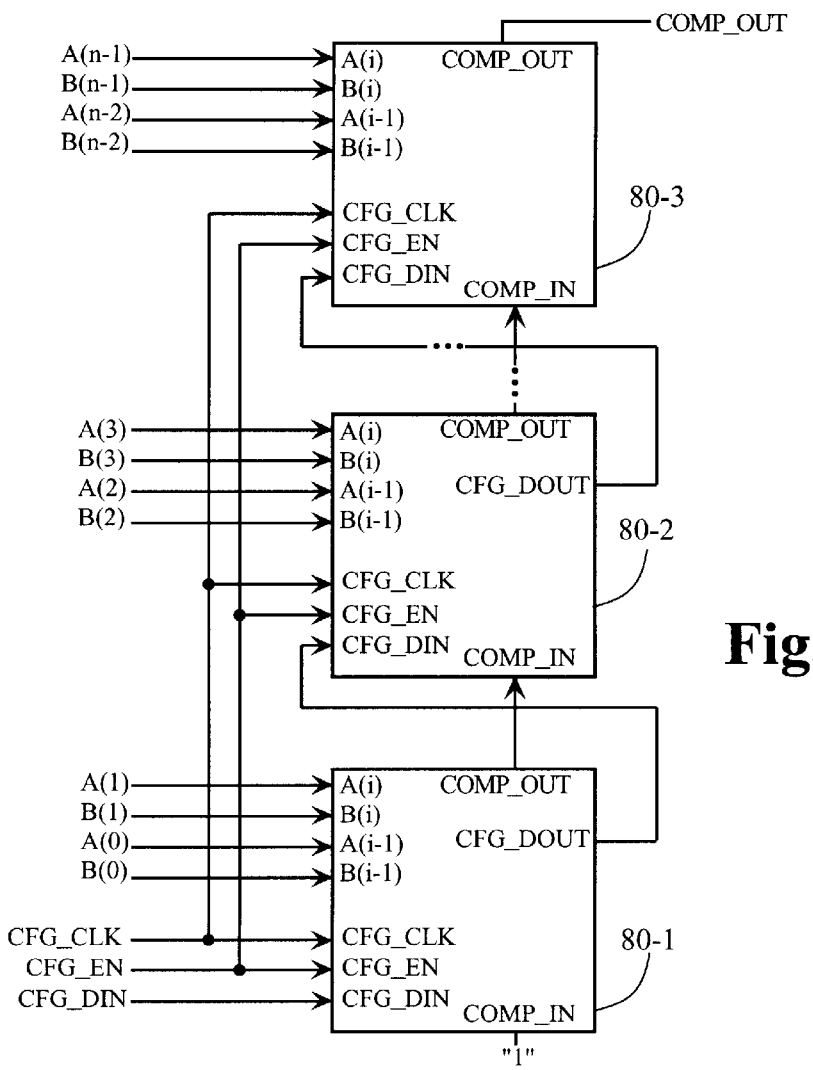
Cascaded exact matching comparator units.

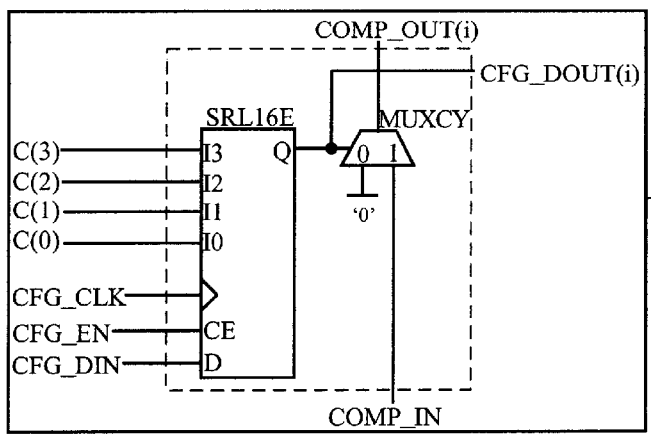
Exact matching comparator unit used to compare four digits per stage to a constant
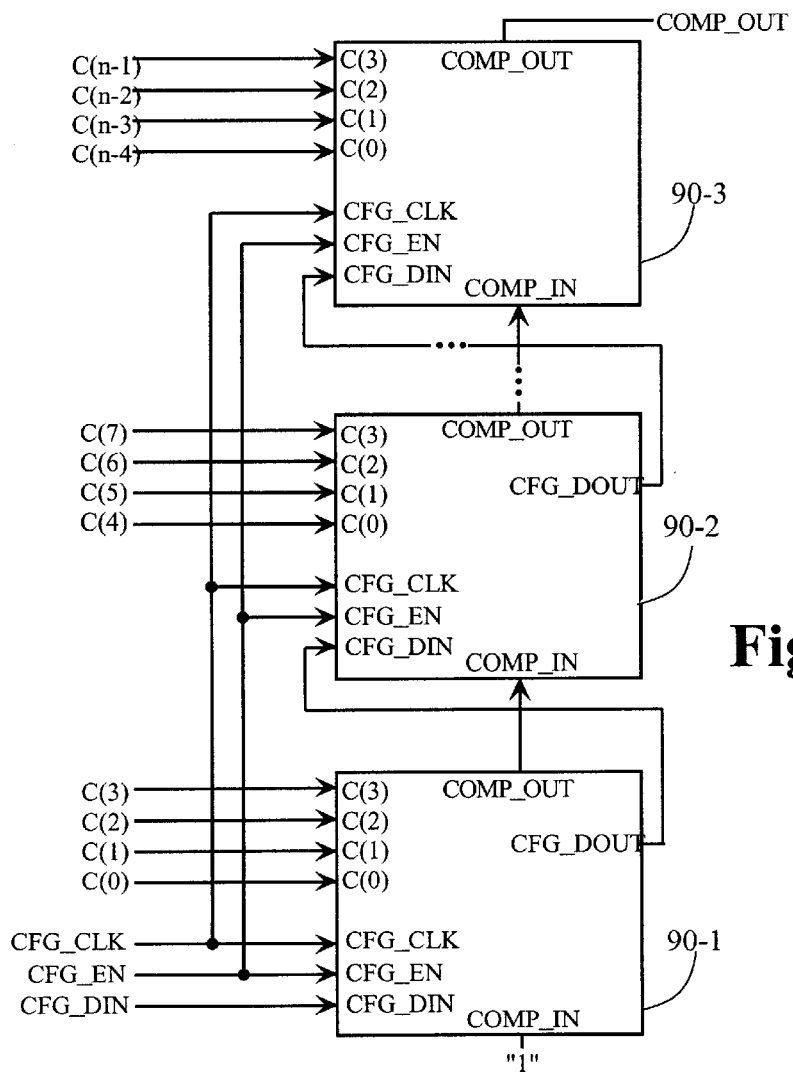
Cascaded exact matching comparator units.

Relative matching comparator unit used to compare one input at a time.

Cascaded relative matching comparator units.

Combined exact and relative matching comparator unit used to compare one set of inputs at a time.

Cascaded combined exact and relative matching comparator units.

LOGIC BLOCK USED AS DYNAMICALLY CONFIGURABLE LOGIC FUNCTION

FIELD OF THE INVENTION

The invention relates to programmable logic devices, more particularly to using programmable logic devices to implement a selected logic function.

BACKGROUND OF THE INVENTION

As programmable logic devices (PLDs), and particularly field programmable gate arrays (FPGAs) have become more powerful, it has become both possible and practical to use them to perform more powerful functions more efficiently.

An early improvement to the basic FPGA structure allowed a lookup table (function generator) to either be loaded as part of a configuration bitstream or be loaded from the interconnect structure. This option was particularly useful for forming small distributed RAM in the memory cells of the lookup tables. The option also allowed for changing configuration of a lookup table without reloading a bitstream into the entire FPGA. Freeman et al. in U.S. Pat. No. 5,343,406 entitled "Distributed Memory Architecture for a Configurable Logic Array and Method for Using Distributed Memory" discuss this possibility in their summary of the invention.

A recent introduction to the FPGA market from Xilinx, Inc., assignee of the present invention, is the Virtex® FPGA product line. ("Virtex" is a trademark of Xilinx,Inc. registered in the U.S. Xilinx, Inc is the assignee of the present patent application.) Like other FPGA devices, the Virtex product line uses configurable logic blocks with lookup tables for programming combinatorial logic functions. The Virtex product line uses enhanced function generators to provide three kinds of functions: lookup table for logic function, RAM for distributed memory storage, and shift register useful for FIFO and other operations common in communications applications. U.S. Pat. No. 6,118,298 by Bauer et al. entitled "STRUCTURE FOR OPTIONALLY CASCADING SHIFT REGISTERS" describes in detail the structure in which a function generator can be used as a lookup table, RAM, or shift register, and also describes a recent improvement in which shift registers can be cascaded to form longer shift registers.

FIG. 1 (taken from FIG. 8 of the above Bauer et al patent) shows a structure usable as both a lookup table and a 16-bit shift register. Signal "Shift" causes controller 800 to select between lookup table mode and shift register mode. In lookup table mode, multiplexer 200 receives and decodes four input signals I0 through I3 and decodes them to select the value in one of the 16 memory cells M0 through M15 to provide as output signal O. In shift register mode, data on line CFG_DIN are shifted from memory cell M0 through consecutive memory cells to memory cell M15 as controlled by clock signals Phi1 and Phi2 in clock controller 800. Clock controller 800 generates non-overlapping clock signals to master and slave portions of the memory cells in response to clock signal CFG_CLK when enabled by enable signal CFG_EN.

FIG. 2 shows a symbol for a configurable shift register lookup table SRL16E that can be implemented as shown in FIG. 1.

FIG. 3 illustrates another feature available in the Virtex FPGA from Xilinx, Inc. Function generator 903 provides output signal O. This signal O can serve as an output signal or can control carry multiplexer 923. Also provided is two-input AND gate 61 that provides an input signal to carry multiplexer 923. Use of this AND gate for multiplication is discussed in more detail by Chapman et al. in U.S. patent application Ser. No. 08/786,818 entitled "Configurable Logic Block with AND Gate for Efficient Multiplication in FPGAs", incorporated herein by reference.

It is possible to use AND gate 61 to implement additional valuable functions.

SUMMARY OF THE INVENTION

According to the invention, a portion of an FPGA is configured to form a comparator. The features of the comparator are determined by values stored in lookup tables of the FPGA, and these lookup tables can be reconfigured without disturbing the remainder of the FPGA. In one embodiment, the comparator provides a trigger signal to a logic analyzer also formed in the FPGA, and causes the logic analyzer to start collecting data on logic functions implemented in yet another part of the FPGA. Comparators that perform both exact matching (A=B or A≠B) and relative matching (A>B, A<B, A≧B or A≦B) and one comparison that combines relative and exact matching are disclosed.

Preferably an FPGA having lookup tables that can be loaded as shift registers is used, and preferably the lookup tables can be cascaded to form longer shift registers, so that reconfiguration data can be shifted into a cascaded chain of lookup tables without having to address specific memory cells in the lookup tables and without having to connect lookup tables together through interconnect wiring of the FPGA.

Examples of exact matching of two variables, exact matching of a variable to a constant, relative matching (greater than or equal to) of a variable to a constant, and combined exact and relative matching are disclosed and discussed. Use of comparator for triggering a logic analyzer is also discussed.

BRIEF DESCRIPTION OF THE DRAWINGS

FIG. 7 shows a comparator structure using the shift register lookup table of FIG. 2 configured to implement an exact matching comparator unit able to compare two values each having two digits.

FIG. 8 shows a comparator structure with multiple stages, each as shown in FIG. 7, and configured to implement an exact match of two multi-digit numbers with two digits compared in each stage.

FIGS. 9 and 10 also show a comparator structure and a cascaded chain of comparator structures for performing an exact match, this time with four digits per stage.

DETAILED DESCRIPTION OF THE DRAWINGS

Figure 1:
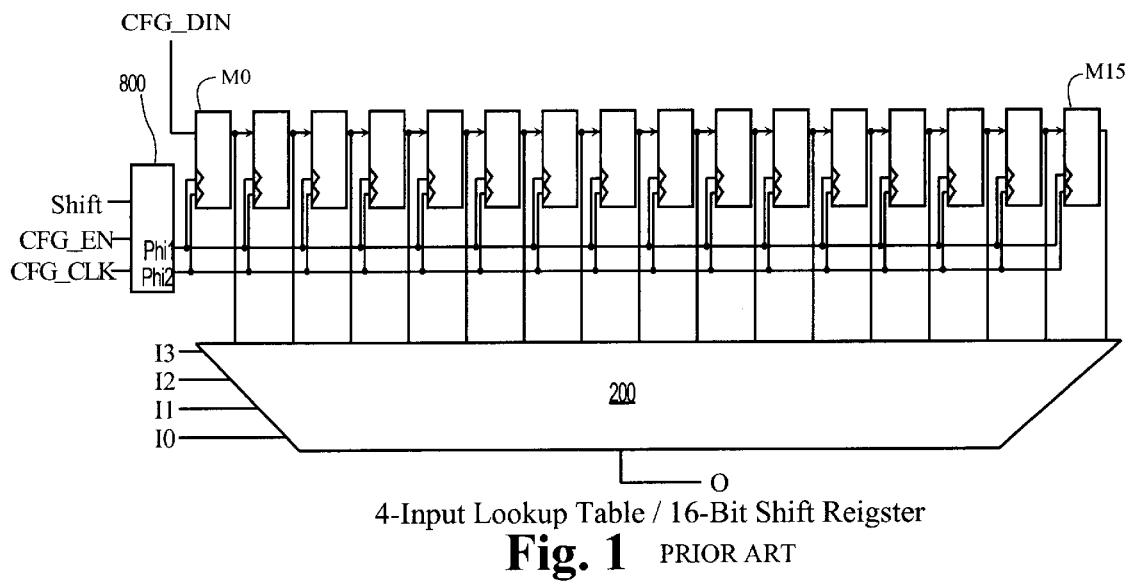
FIG. 1 shows an FPGA structure disclosed in U.S. Pat. No. 6,118,298 that can implement both a lookup table and a shift register.
Figure 2:
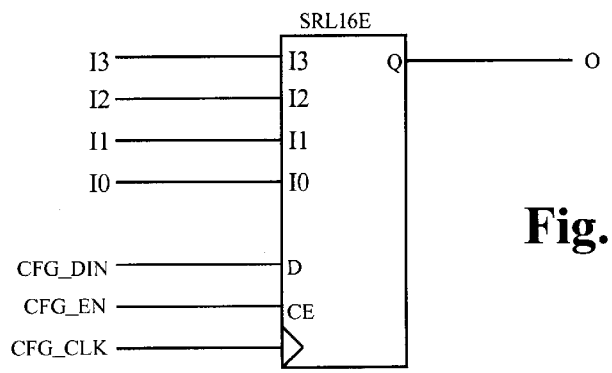
FIG. 2 shows a convenient symbol for a configurable shift register lookup table SRL16E that can be implemented as shown in FIG. 1.
Figure 3:
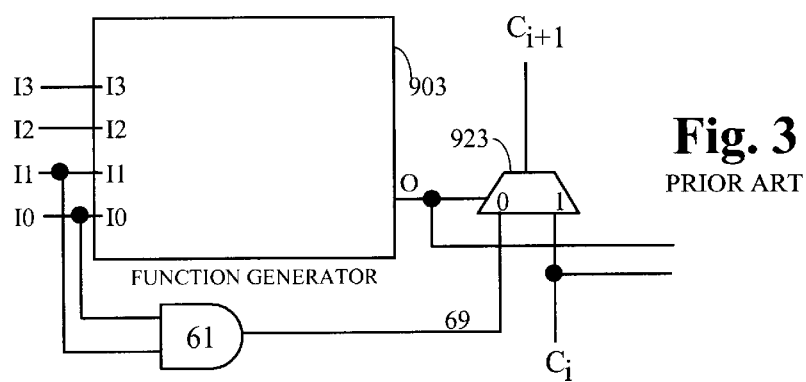
FIG. 3 illustrates a prior art function generator or lookup table with parallel AND gate for controlling a multiplexer.
Figure 4:
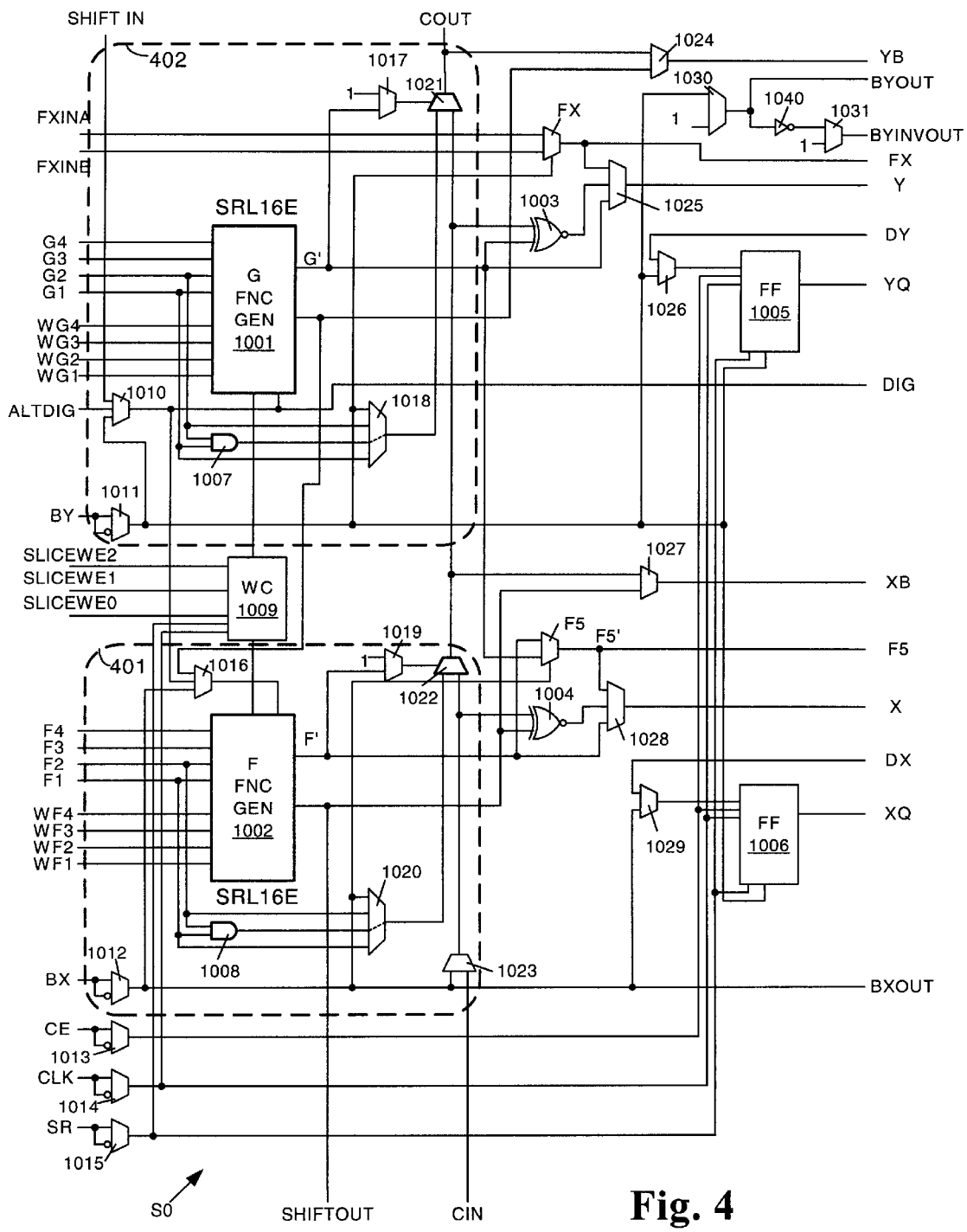
FIG. 4 shows a logic block slice incorporating the elements of FIG. 3 and including a structure in which function generators that comprise shift register lookup tables may be cascaded to form longer shift registers.

FIG. 4 shows an FPGA architecture in which the invention can be implemented. This architecture is described in detail by Bauer et al. in U.S. patent application Ser. No. 09/574,534 incorporated herein by reference. Multiplexers 1021 and 1022 are equivalent to multiplexer 932 of FIG. 3. Function generators 1001 and 1002 of FIG. 4 are equivalent to function generator 903 of FIG. 3. AND gates 1007 and 1008 of FIG. 4 are equivalent to AND gate 61 of FIG. 3. FIG. 4 includes additional structures, in particular flip flops 1005 and 1006 and a plurality of routing multiplexers. These are typically provided in FPGAs available from Xilinx,Inc. so that users may route and store signals while their designs are operating. The function generators 1001 and 1002 of FIG. 4 preferably but not necessarily include the ability to shift a value from one memory cell to the next as shown in FIG. 1, so that the value (or 16 values) in the function generator may be changed during operation without having to address each specific memory cell in the function generator.

The present invention takes advantage of the fact that the function generators can be reconfigured during operation without disturbing or even stopping operation of the remainder of the FPGA. The structure of FIG. 4 operates in two distinct modes: a configuration mode in which a portion of the FPGA such as shown in FIG. 4 is being loaded with a new configuration, and an operation mode in which this portion of the FPGA ins performing the function specified by the function generators.

Figure 5A:
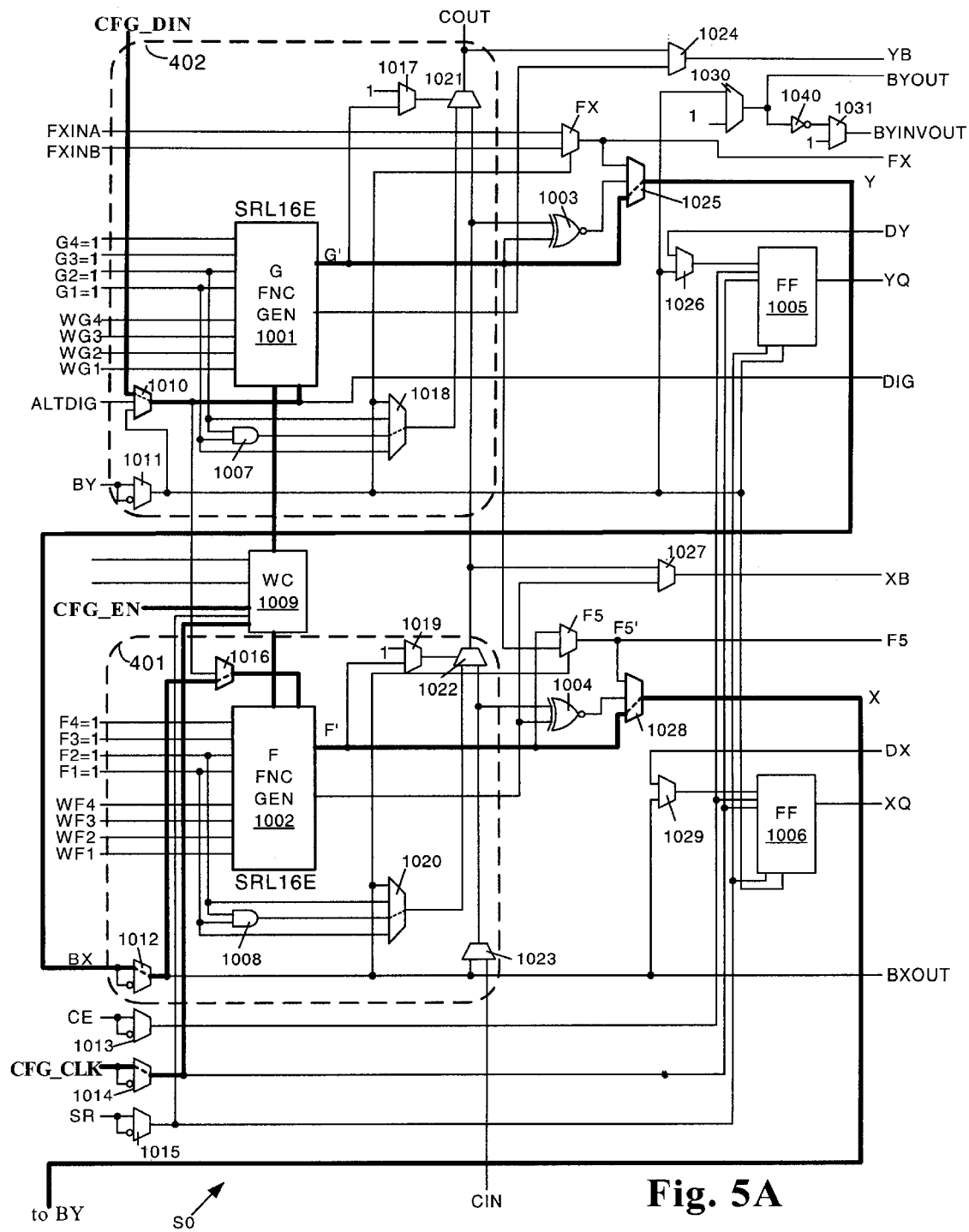
FIG. 5A shows a modification of the structure of FIG. 4 to eliminate the cascade lines and with lines used during configuration shown in bold.

FIG. 5A shows a modification of FIG. 4 in which no dedicated line is provided to cascade function generators together to form longer shift registers. In FIG. 5A, certain lines are shown in bold to indicate signals used during configuration of these function generators. The lines shown in bold make use of the shift registers present within each function generator (see FIG. 1). Because no cascade structure is present for carrying signals directly from one function generator to the next, all input signals G1 through G4 and F1 through F4 are set to 1 to connect the last memory cell in the function generator to its output terminal G' or F'. The bitstream to be loaded CFG_DIN is applied to the SHIFT_IN terminal, and multiplexer 1010 is set to forward this signal to the shift-in input terminal of G function generator 1001. The function generator output signal (the output of the last memory cell in the shift register) is forwarded by multiplexer 1025 to output line Y, and from there through interconnect wiring to input line BX. From there, multiplexer 1012 forwards the bitstream to multiplexer 1016, which applies the signal to the shift-in input terminal of F function generator 1002. If there are more shift registers in the chain, all input signals F1 through F4 equal to 1 cause the last bit of the shift register to be the output signal F', and the data are shifted to the BY input of the next stage through output line Y and further interconnect wiring. Write strobe controller 1009 is activated by configuration enable signal CFG_EN to respond to configuration clock signal CFG_CLK provided by multiplexer 1014. When CFG_EN is high (active), each rising edge of CFG_CLK causes write strobe controller 1009 to apply write strobes to F and G function generators 1001 and 1002, thus moving the data applied to CFG_DIN to the next memory cell in the shift register.

Figure 5B:
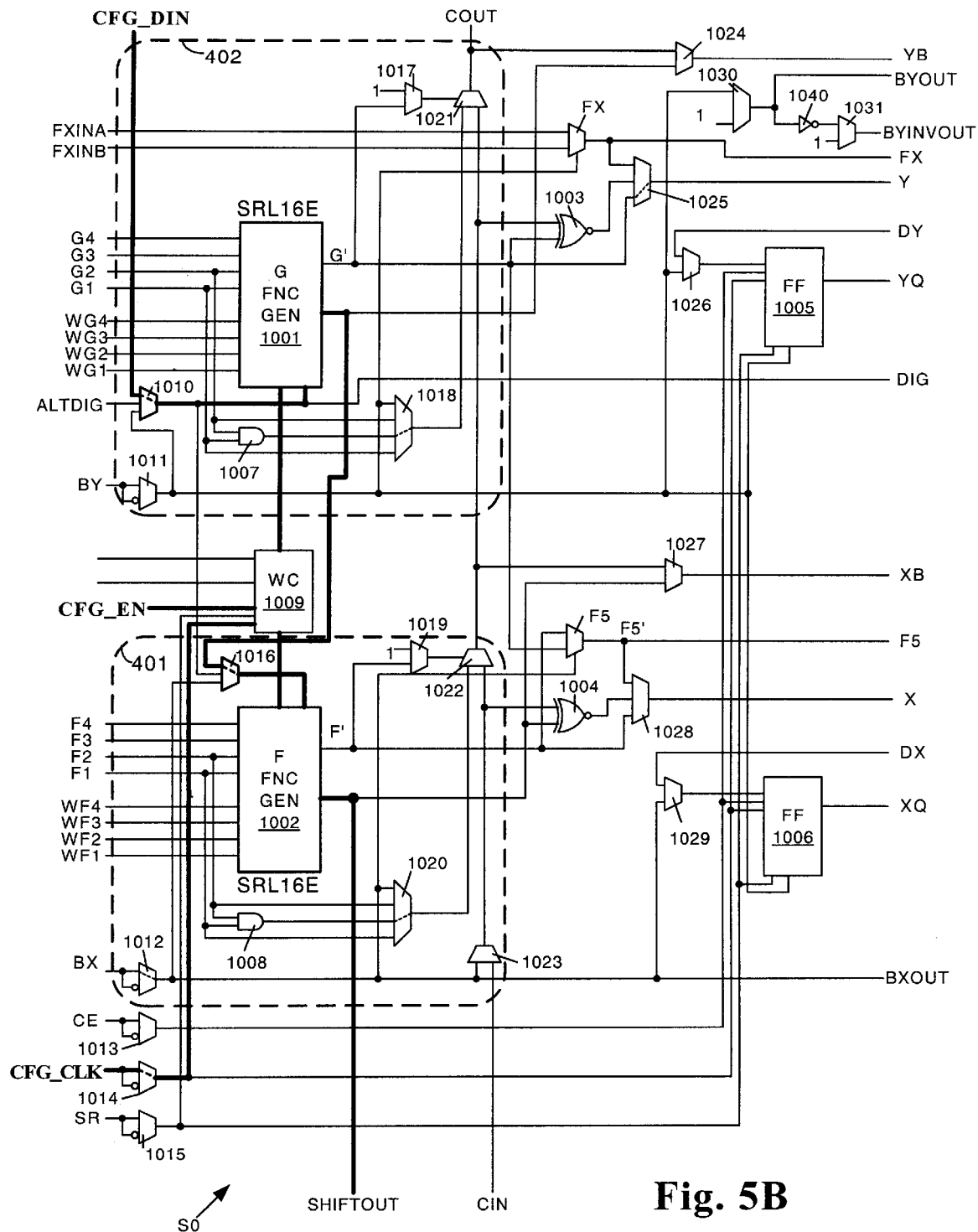
FIG. 5B shows the structure of FIG. 4 with lines used during configuration shown in bold.

FIG. 5B shows the configuration path in another embodiment having a direct path for cascading shift registers together. The embodiment of FIG. 5B has a second output from the function generators. This second output always comes from the last memory cell in the shift register, so in this embodiment it is not necessary to set the function generator input signals to logic 1 while loading the shift registers. Also, it is not necessary to use interconnect wiring to connect one shift register to the next. Multiplexer 1016 receives a third input CFG_DOUT from function generator 1001, taken from the last memory cell in the shift register of function generator 1001, and is configured to provide this signal as the CFG_DIN input to the shift register in function generator 1002. Many of these function generators can be connected together if desired and configured by a single bitstream.

Figure 6:
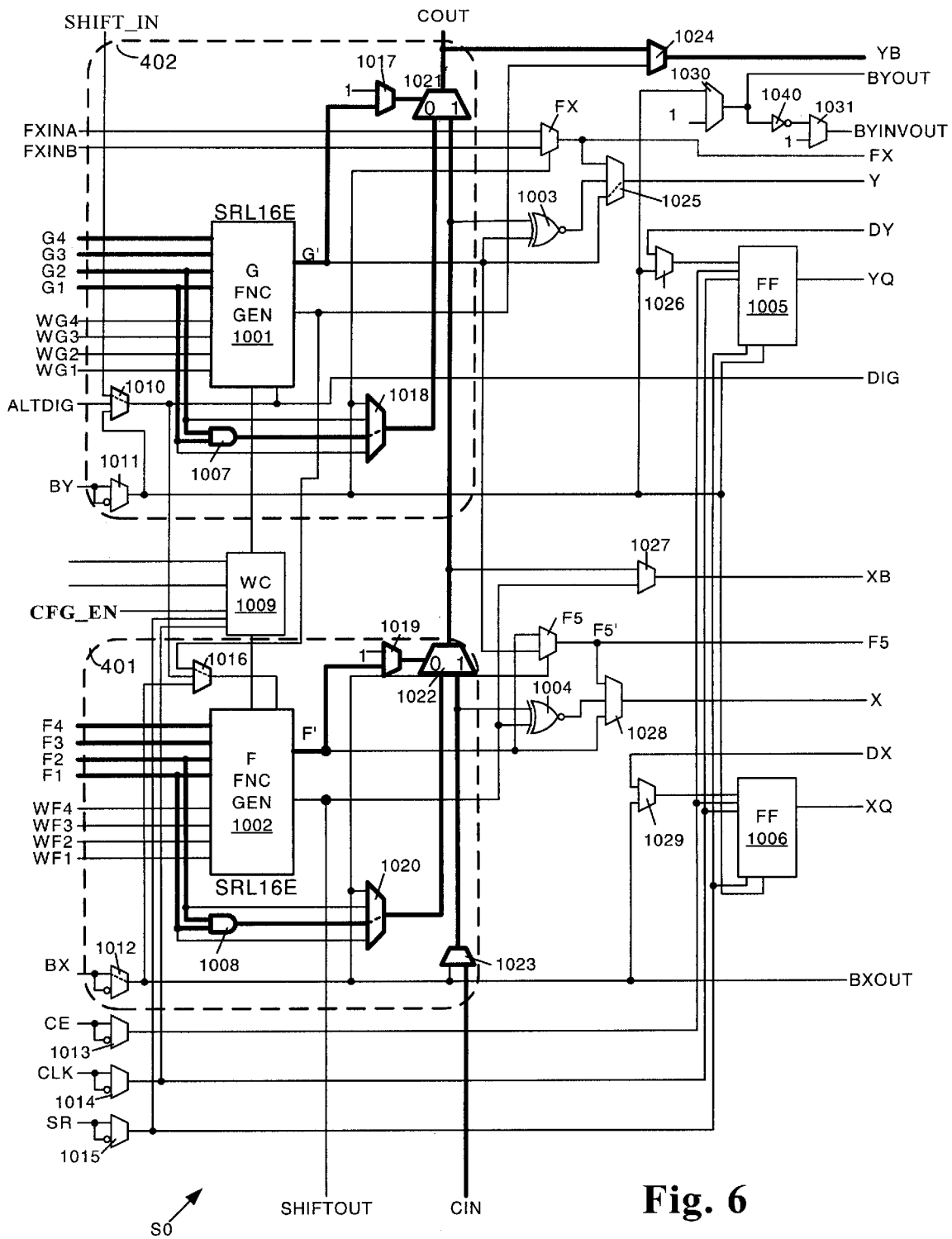
FIG. 6 shows the structure of FIG. 4 with lines used during operation shown in bold.

FIG. 6 highlights signals used during operation mode. In this embodiment, the configuration enable signal CFG_EN is low, so write controller 1009 does not send write strobes to function generators 1001 and 1002 in response to clock signals from multiplexer 1014. The desired configuration is already stored in function generators 1001 and 1002 (and any other function generators in the claim). These function generators now respond to signals G1 through G4 and F1 through F4. Multiplexers 1018 and 1020 are programmed to receive the output signals from AND gates 1007 and 1008. Several examples will now be provided to show how this structure can implement the dynamically configurable comparator of the present invention.

A 16-memory cell lookup table can provide 65,536 different functions of four input signals ($2^{16}$ functions). The function is determined by the pattern of 16 bits loaded into the lookup table. The 4 input signals control a multiplexer to select one of the 16 bits to provide as output. For multiplexer structures formed in different ways, the same bit pattern produces different functions. Typically software programs determine the appropriate bit pattern to produce a desired truth table using the particular multiplexer structure of the FPGA that will implement the design.

We will now present several examples of comparators that can be formed by loading different bit patterns into the lookup table and applying different input signals to the input terminals. The following examples assume that the multiplexer at the lookup table output uses I3 as the most significant input bit and I0 as the least significant input bit, and is loaded with the most significant load value bit first. Thus input signal I3 selects between the first and last set of 8 bits, I2 selects between the top and bottom four of each set of 8 and so on. It is not important to the invention to use a particular bit pattern, only to match the input signals with the bit pattern that has been loaded to produce the desired truth table of output value as a function of the input values.

Dynamically Configurable Comparators—Examples

Three types of dynamically configurable comparators will be described:

"Exact" matching or "wide-AND" comparator

"Relative" matching comparator

Combined "exact" and "relative" comparator

Exact Matching Comparator

The exact matching comparator is used to compare between two variables or between a variable and a constant using the following comparison functions:

Equal to
Not equal to
Don't care

For exact matching of two variables in four-input function generators, two digits can be compared in each function generator. An exact matching comparator can determine whether two values are equal or whether two values are not equal. An exact matching comparator can also compare a value to a "don't care" which always results in a successful comparison.

FIG. 7 shows an exact matching comparator configuration used to compare two sets of inputs in one stage. The four input terminals 10 through 13 of shift register lookup table SRL16E are connected to receive two digits of a first value A and two digits of a second value B, connected as shown.

During configuration, in order to set up the comparison logic function for "equal to" or "not equal to", the 16 memory cells inside the SRL16E lookup table are loaded with the configuration value CFG_VAL= 1001000000001001. This causes the following truth table (Table I) to result.

TABLE 1

| A(i) | B(i) | A(i − 1) | B(i − 1) | CFG_VAL |
|---|---|---|---|---|
| 0 | 0 | 0 | 0 | 1 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 1 |
| 1 | 1 | 0 | 1 | 0 |
| 1 | 1 | 1 | 0 | 0 |
| 1 | 1 | 1 | 1 | 1 |

It can be seen by inspecting TABLE I that when A(i)=B(i) AND A(i−1)=B(i−1) CFG_VAL is 1. Otherwise CFG_VAL=0. Thus the configuration produces an exact match comparison of A and B. It is important to note that both the "equal to" and the "Not equal to" functions, only the "Equal to" comparison function need to be implemented in each stage of the cascaded exact matching comparison unit. The "Not equal to" function is implemented by simply inverting the sense of the COMP_OUT output of the last stage of the comparator.

A "don't care" comparison function can also be implemented. A "don't care" comparison produces a successful output regardless of the value of a particular input. For instance, in order to set up the comparison logic function in which we don't car whether A(i)=B(i)or whether A(i−1)=B(i−1), the 16 memory cells inside the SRL16E lookup table are loaded with the configuration value CFG_VAL= 1111111111111111. If we do want to test for A(i)=B(i) but don't care whether A(i−1)=B(i−1), the 16 memory cells inside the SRL16E lookup table are loaded with the configuration value CFG_VAL=1111000000001111.

A typical comparator will compare more than two digits. If it is desired to compare multi-bit numbers, the comparison operation typically uses a chain of function generators and compares one, two, or four digits in each function generator. Thus a cascaded chain of comparators is used.

FIG. 8 shows a cascaded comparator chain in which two digits of the values being compared are processed in each stage. For the exact match comparison, each stage is loaded with the same CFG_VAL=1001000000001001.

The embodiment of FIG. 8 is shown with the COMP_OUT values being passed upward in the chain. Looking back at FIGS. 5A and 5B, it can be seen that the configuration values are loaded starting at the top. The order of loading is not important as long as the right values end up in the right memory cells.

Note that in the first stage 80-1 a logical 1 value is provided to the COMP_IN terminal and that within each logic unit 80 (see FIG. 7) a logic 0 is provided to the 0 input of carry multiplexer MUXCY. Thus in the first stage 80-1, equality produces a logic 1 value on the COMP_OUT terminal. If any stage encounters an inequality, the carry multiplexer MUXCY of that stage will pass the logic 0 value at its 0 input terminal and from then on, the value forwarded down the chain is logic 0 regardless of whether it comes from the COMP_IN input terminal of MUXCY or from the logic 0 input terminal. Thus the COMP_OUT signal of the last stage 80-3 reflects whether the comparison produces an exact match. If a "Not equal to" function is desired, the last COMP_OUT signal is simply inverted.

In addition to the above exact match between two variables A and B, it is possible to compare a variable to a constant. Of course, the constant can simply be applied to one of the inputs A or B and the variable applied to the other, and processed as described above. Alternatively, two digits of A can be compared to a constant by loading the constant into the lookup table, with the B inputs not used. The following example compares the variable A to the binary value "10", producing a logic 1 at the COMP_OUT terminal when A(i)=1 AND A(i−1)=0.

TABLE II

| A(i) | Unused input B(i) | A(i − 1) | Unused input B(i − 1) | CFG_VAL |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 1 |
| 1 | 0 | 0 | 1 | 1 |
| 1 | 0 | 1 | 0 | 0 |
| 1 | 0 | 1 | 1 | 0 |
| 1 | 1 | 0 | 0 | 1 |
| 1 | 1 | 0 | 1 | 1 |
| 1 | 1 | 1 | 0 | 0 |
| 1 | 1 | 1 | 1 | 0 |

For another example, as shown in FIG. 9, cascaded comparator units can compare four digits per stage to a constant. In this example, the constant is the decimal number "9", and the lookup table is loaded with CFG_VAL= 0000000100000000. Only when the four input signals C(0) through C(3) are 1001 (the binary equivalent of decimal 9) will the lookup table select the logic 1 loaded at the ninth location.

For the multi-stage structure of FIG. 10, the binary equivalent of the constant being compared is loaded through the cascaded string of shift registers until the shift registers are configured to hold this constant. Then, as indicated by the digits of FIG. 10, the multi-digit value to be compared is applied to the inputs C(0) through C(n−1) of the cascaded structure. If the match condition is present on the variable inputs, the CFG_VAL output will select the carry-in input of the MUXCY to be passed on to the next stage. The value of the carry-in input for the first stage is always a logical '1'. If the match condition is not present, then a logical '0' is passed to the next stage. Only an exact match will cause a logic 1 to propagate from the first stage all the way to COMP_OUT of the last stage.

Relative Comparison

The method of the invention can make relative as well as exact comparisons. Relative comparison includes the comparisons greater than or equal to a constant, greater than a constant, less than a constant, and less than or equal to a constant. A single function can make all four relative comparisons because the constant being compared can simply be adjusted by one. For example, in integer arithmetic, "greater than or equal to 9" is the same as "greater than 8". And "less than" is the inverse of "greater than or equal". The following examples will use only the "greater than or equal to" comparison. Other comparison functions are implemented using the "greater than or equal to" function as follows:

"A is greater than K" is implemented as "A is greater than or equal to K+1".

"A is greater than or equal to K" is implemented directly.

"A is less than K" is implemented as the inverse of "A is greater than or equal to K".

"A is less than or equal to K" is implemented as the inverse of "A is greater than or equal to K+1".

"A is greater than or equal to zero" is always true.

"A is less than zero" is always false.

"A is less than or equal to the largest possible value" is always true.

"A is greater than the largest possible value" is always false.

Figure 11:
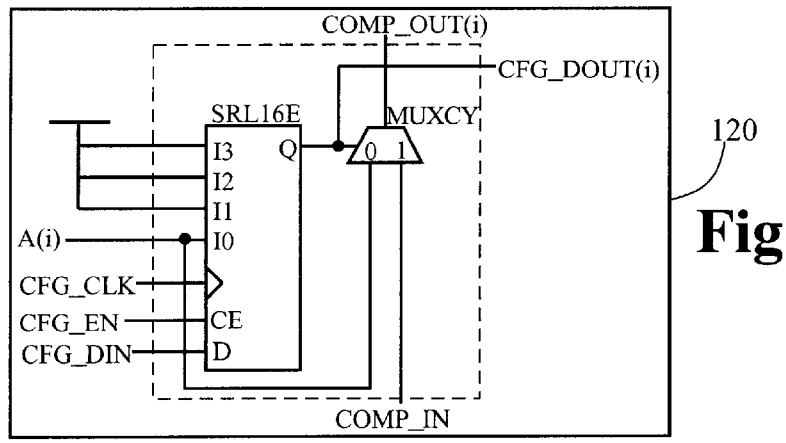
FIGS. 11 and 12 show single stage and multi-stage comparator units configured to implement relative comparison (greater than or equal, less than or equal, etc) with one digit compared in each stage.

FIG. 11 shows a simple relative comparator in which one variable A(i) is compared to the value "0". The comparison uses the "Greater than or equal to" comparison function. In order to implement this function, the CFG_VAL=0100000000000000 is loaded into the lookup table and three of the input terminals I1, I2, and I3 are tied high during configuration mode, as shown in TABLE III below:

TABLE III

| Unused input I3 | Unused input I2 | Unused input I1 | A(i) | CFG_VAL |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 1 |
| 1 | 1 | 1 | 1 | 0 |

Note that if the input A(i)='0' (which is ≧'0'), then the result of the previous stage (or a logical '1' if it is the first stage) is passed on to the next stage. If the input A(i)='1' (which is also ≧'0'), then the value of the input A(i)='1' is passed on to the next stage.

Now let us assume that the variable input A(i) is to be compared with the value "1" using the "Greater than or equal to" comparison function. In order to implement this function, the three input terminals I1, I2, and I3 are tied to logic 1 and the CFG_VAL=1000000000000000 is loaded into the lookup table during configuration mode, as shown in TABLE IV below:

TABLE IV

| Unused input I3 | Unused input I2 | Unused input I1 | A(i) | CFG_VAL |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

Note that if the input A(i)='0' (which is not ≧'1'), then the value of A(i)='0' is passed on to the next stage. If the input A(i)='1' (which is ≧'1'), then the result of the previous stage (or a logical '1' if it is the first stage) is passed on to the next stage.

The following example illustrates how the "greater than or equal to" comparison function works to check if the variable decimal 10 (binary 1010) is greater than or equal to the constant decimal 9 (binary 1001). This comparison takes four stages, one for each of the digits 1010.

In stage 0, A(0)='0' is compared to see if it is greater than or equal to '1'. Since A(0) is neither greater than nor equal to '1', the input A(0)='0' is passed on to stage 1.

In stage 1, A(1)='1' is compared to see if it is greater than or equal to '0'. Since A(1) is greater than '0', the input A(1)='1' is passed on to stage 2.

In stage 2, A(2)='0' is compared to see if it is greater than or equal to '0'. Since A(2) is equal to '0', the result ='1' from the previous stage is passed on to stage 3.

In stage 3, A(3)='1' is compared to see if it is greater than or equal to '1'. Since A(3) is equal to '1', the previous stage result ='1' is passed on to COMP_OUT, thereby signifying that decimal 10 (binary 1010) is greater than or equal to decimal 9 (binary 1001).

It is important to note that in a relative comparison function, the upper bits of the input (the most significant bits) have more influence in determining the outcome of the result.

Figure 12:
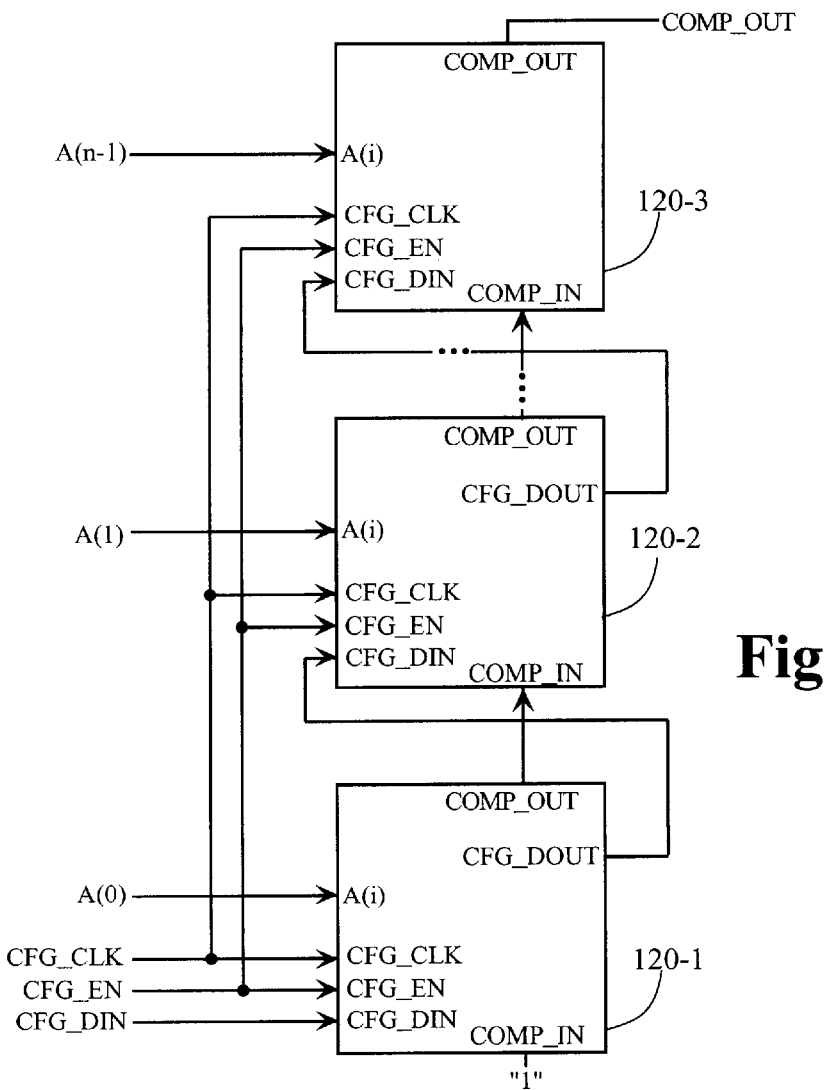

FIG. 12 illustrates a cascaded relative matching comparator in which each stage makes one of the comparisons discussed above. One digit is compared to the value 0 or 1 present in the lookup table and is used to generate the COMP_OUT signal from that stage. The last COMP_OUT signal indicates success or failure of the comparison.

Combined Exact and Relative Comparison

By taking advantage of the AND gate 61 shown in FIG. 3 it is possible to configure the FPGA to offer a choice of two comparisons without having to reload lookup tables.

Figure 13:
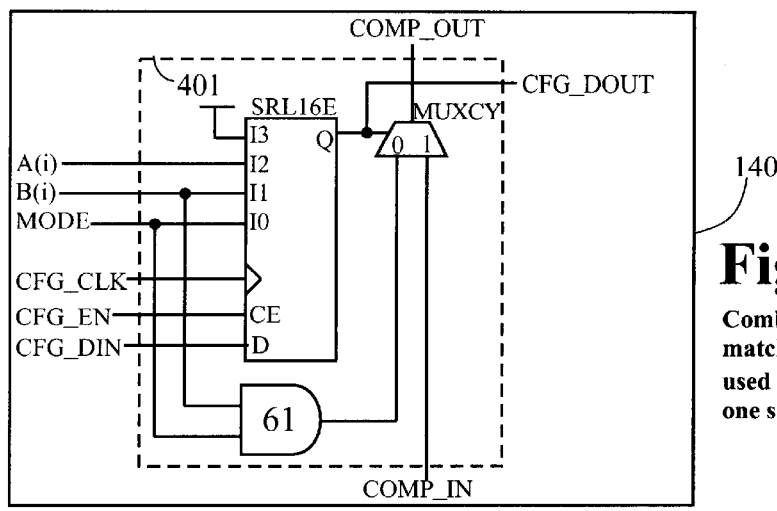
FIGS. 13 and 14 show single stage and multi-stage combined comparator units configured to implement a selected one of exact and relative matching, with one digit compared in each stage.

FIG. 13 shows the structure including the AND gate of the combined exact and relative matching comparator unit.

AND gate 61 of FIG. 13 is equivalent to AND gates 1007 and 1008 of FIG. 4, and is activated as shown in FIG. 4 by configuring multiplexers 1018 and 1020 to select the outputs of AND gates 1007 and 1008.

As shown in FIG. 13, one of the input terminals I0 or I1 receives a MODE signal.

MODE='0' causes exact matching type comparison
MODE='1' causes relative matching type comparison The other terminal I0 or I1 receives the variable B(i). When this MODE signal is logic 0, AND gate 61 applies a logic 0 to multiplexer MUXCY, producing the logic 0 input shown in FIG. 7 and used for exact matching. When MODE is logic 1, AND gate 61 forwards the value B(i) to the '0' input of multiplexer MUXCY. This produces the result discussed above in connection with FIG. 11 for relative comparison.

Figure 14:
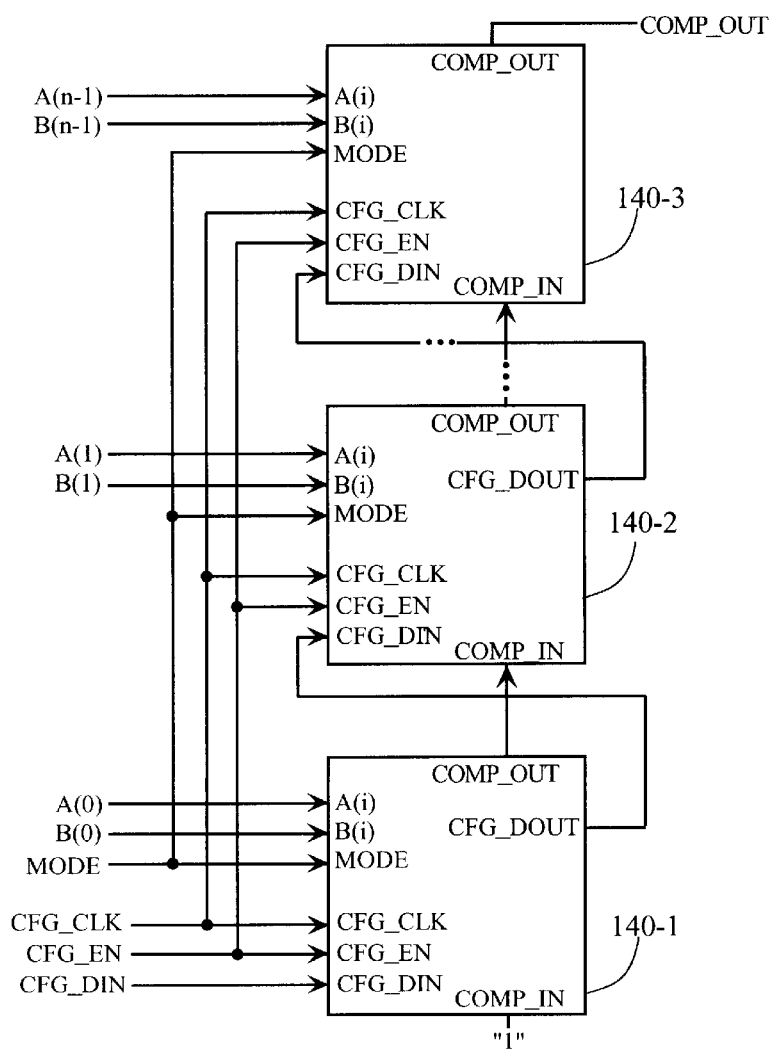

FIG. 14 shows a cascade chain making use of this structure. Each stage compares one bit B(i) to a constant stored in the lookup table. If MODE='0', the structure performs an exact comparison, comparing one digit per stage. If MODE='1', the structure performs a relative comparison, as discussed for FIG. 10.

Logic Analyzer

The comparator of the invention is particularly useful for triggering a logic analyzer to start collecting data on other portions of the FPGA. When a designer is developing a complex design to be implemented by an FPGA, the design under development may include errors that are hard for the designer to locate and fix. Designers may wish to integrate a logic analyzer module as a small portion of the overall FPGA by connecting various nets in the application to the integrated logic analyzer module before or after circuit implementation.

After circuit implementation and during application runtime, the comparators that are a part of the integrated logic analyzer module are programmed with logic comparison functions that enable the comparator units to find various patterns on the application net inputs. Due to the nature of the run-time programmable comparator, the search patterns can be changed during run-time without having to re-design and/or re-implement the application circuit.

Once the desired pattern is detected by the comparator, the integrated logic analyzer module captures data from the application. After data is captured and uploaded to a computer, the programmable comparators of the integrated logic analyzer module can be re-programmed to find different patterns.

The integrated logic analyzer complete with programmable comparators provides designers with a convenient way to test the design or portions of the design as it is being developed.

Other Embodiments

Many other embodiments of the comparator of the invention and many other examples of how it can be used will become obvious to one skilled in the art in light of the above description. The invention is defined by the following claims.

What is claimed is:

1. In an FPGA, comprising:
   I. a general interconnect structure; and
   II. an array of logic blocks, each logic block comprising:
      a. a lookup table configurable as a shift register, the lookup table having a shift register input terminal, a plurality of data input terminals and an output terminal;
      b. a carry multiplexer controlled by the output terminal of the lookup table, having
         i. an output terminal,
         ii. a first input terminal that may be coupled to the output terminal of another carry multiplexer, and
         iii. a second input terminal;
      c. an AND gate having an output terminal connectable to the second input terminal of the carry multiplexer and two input terminals connected to two of the plurality of data input terminals of the lookup table;
   a programmable comparator for comparing at least one value on at least one of the plurality of input terminals of the lookup table to at least one other value, the programmable comparator having two modes, a loading mode and an operating mode, wherein
      in the loading mode a clock signal causes a bitstream to be shifted from the shift register input terminal into the lookup table; and
      in the operating mode the bitstream in the lookup table performs a comparison function implemented such that a successful comparison causes the carry multiplexer to connect to its output terminal an input terminal whose value represents the successful comparison, and a failed comparison causes the carry multiplexer to connect to its output terminal an input terminal whose value represents a failed result.

2. The programmable comparator of claim 1 wherein the comparison comprises an exact match type of comparison, and a successful comparison causes the carry multiplexer to connect the first input terminal to the output terminal and a failed comparison causes the carry multiplexer to connect the second input terminal to the output terminal.

3. The programmable comparator of claim 2 wherein at least one of the plurality of inputs is compared with a "don't care" constant value.

4. The programmable comparator of claim 2 wherein the programmable comparator determines that a successful comparison occurs when the value on one of the plurality of input terminals is equal to another value on another one of the plurality of input terminals.

5. The programmable comparator of claim 2 wherein the programmable comparator determines that a successful comparison occurs when the value on one of the plurality of input terminals is equal to a constant stored in the lookup table.

6. The programmable comparator of claim 2 wherein the programmable comparator determines that a successful comparison occurs when the value on one of the plurality of input terminals is not equal to a constant stored in the lookup table.

7. The programmable comparator of claim 1 wherein the comparison comprises a relative match type of comparison, and a successful comparison of "equal to" causes the carry multiplexer to connect the second input terminal to the output terminal, a successful comparison of "greater than" causes the carry multiplexer to connect the first input terminal to the output terminal, and a failed comparison causes the carry multiplexer to connect the first input terminal to the output terminal.

8. The programmable comparator of claim 7 wherein the programmable comparator determines that a successful comparison occurs when the value on one of the plurality of input terminals is greater than a constant stored in the lookup table.

9. The programmable comparator of claim 7 wherein the programmable comparator determines that a successful comparison occurs when the value on one of the plurality of input terminals is not greater than a constant stored in the lookup table.

10. The programmable comparator of claim 7 wherein the programmable comparator determines that a successful comparison occurs when the value on one of the plurality of input terminals is less than a constant stored in the lookup table.

11. The programmable comparator of claim 7 wherein the programmable comparator determines that a successful comparison occurs when the value on one of the plurality of input terminals is not less than a constant stored in the lookup table.

12. The programmable comparator of claim 1 wherein the lookup table configurable as a shift register further has a shift register output terminal connectable to the shift register input terminal of another one of the logic blocks in the array.

13. The programmable comparator of claim 1 wherein when the programmable comparator is in the loading mode, the plurality of data input terminals each receive an input signal that cause the output terminal of the lookup table configurable as a shift register to be connected to a last memory cell in the shift register, and wherein the output terminal of the lookup table is connected to the shift register input terminal of another lookup table.

14. The programmable comparator of claim 13 wherein the modes of the comparator are controlled by a configuration enable signal that disables the shift registers when in operating mode.

15. The programmable comparator of claim 13 wherein the plurality of data input terminals of the lookup table are each connected to an output terminal of a flip flop and the configuration enable signal is connected to an asynchronous reset terminal of each flip flop.

16. The programmable comparator of claim 1 wherein the comparator includes a last multiplexer at an end of a chain of all multiplexers in the comparator that generates a comparator output signal and wherein this comparator output signal triggers a logic analyzer in the FPGA to start collecting data.

17. An FPGA configuration wherein a portion of the configuration is a logic analyzer for providing information to a user about operation of another portion of the configuration, and wherein part of the configuration of the logic analyzer is determined when the FPGA is configured and another part of the configuration of the logic analyzer is determined by another portion of the logic analyzer.

18. The FPGA of claim 17 wherein the part of the configuration of the logic analyzer determined by another portion of the logic analyzer includes a value stored in at least one lookup table.

19. The FPGA of claim 18 wherein the lookup table is connectable as a shift register and configured by loading a bitstream through the shift register.

20. The FPGA of claim 18 wherein the at least one lookup table comprises a plurality of lookup tables.

21. The FPGA of claim 18 wherein the plurality of lookup tables are loaded by shifting a bitstream through a shift register.

* * * * *